United States Patent
Kitagawa et al.

(10) Patent No.: US 10,261,413 B2
(45) Date of Patent: Apr. 16, 2019

(54) PHOTOCURABLE COMPOSITION FOR IMPRINTS, PATTERN FORMING METHOD, AND METHOD FOR MANUFACTURING DEVICE

(71) Applicant: FUJIFILM Corporation, Tokyo (JP)

(72) Inventors: Hirotaka Kitagawa, Haibara-gun (JP); Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/622,474

(22) Filed: Jun. 14, 2017

(65) Prior Publication Data

US 2017/0285468 A1 Oct. 5, 2017

Related U.S. Application Data

(63) Continuation of application No. PCT/JP2015/086164, filed on Dec. 25, 2015.

(30) Foreign Application Priority Data

Dec. 25, 2014 (JP) ................................. 2014-261756

(51) Int. Cl.

| | |
|---|---|
| *G03F 7/00* | (2006.01) |
| *C08F 2/48* | (2006.01) |
| *C08F 214/18* | (2006.01) |
| *H01L 21/027* | (2006.01) |
| *B41M 5/00* | (2006.01) |
| *C09D 7/40* | (2018.01) |
| *C08F 2/44* | (2006.01) |
| *C08F 2/50* | (2006.01) |
| *C08F 220/22* | (2006.01) |
| *C09D 11/30* | (2014.01) |
| *B41M 7/00* | (2006.01) |
| *C08F 222/10* | (2006.01) |
| *C08F 220/18* | (2006.01) |
| *C09D 11/101* | (2014.01) |
| *C09D 11/102* | (2014.01) |
| *G03F 7/004* | (2006.01) |
| *G03F 7/027* | (2006.01) |

(52) U.S. Cl.
CPC ......... *G03F 7/0002* (2013.01); *B41M 5/0047* (2013.01); *B41M 7/0081* (2013.01); *C08F 2/44* (2013.01); *C08F 2/48* (2013.01); *C08F 2/50* (2013.01); *C08F 220/18* (2013.01); *C08F 220/22* (2013.01); *C08F 222/1006* (2013.01); *C09D 7/40* (2018.01); *C09D 11/101* (2013.01); *C09D 11/102* (2013.01); *C09D 11/30* (2013.01); *G03F 7/0046* (2013.01); *G03F 7/027* (2013.01); *H01L 21/0271* (2013.01); *C08F 2222/102* (2013.01)

(58) Field of Classification Search
CPC ....... C08F 2/48; C08F 214/186; G03F 7/0002
See application file for complete search history.

(56) References Cited

U.S. PATENT DOCUMENTS

| | | | |
|---|---|---|---|
| 7,883,764 B2 | 2/2011 | Murao | |
| 8,540,925 B2 | 9/2013 | Kawaguchi et al. | |
| 8,859,071 B2 | 10/2014 | Kodama | |
| 9,868,846 B2 * | 1/2018 | Kodama | .................. C08F 2/46 |
| 2007/0269747 A1 * | 11/2007 | Bahadur | ................ B82Y 10/00 |
| | | | 430/319 |
| 2008/0107870 A1 | 5/2008 | Kawaguchi et al. | |
| 2008/0167396 A1 | 7/2008 | Murao | |
| 2009/0052030 A1 * | 2/2009 | Kaida | .................... B82Y 10/00 |
| | | | 359/485.05 |
| 2011/0059302 A1 | 3/2011 | Kodama | |
| 2012/0288686 A1 | 11/2012 | Xu et al. | |
| 2014/0154471 A1 | 6/2014 | Kodama et al. | |

(Continued)

FOREIGN PATENT DOCUMENTS

| | | |
|---|---|---|
| JP | 2006-114882 A | 4/2006 |
| JP | 2008-095037 A | 4/2008 |
| JP | 2010-045163 A | 2/2010 |

(Continued)

OTHER PUBLICATIONS

Stephen Y. Chou et al., "Imprint of sub-25 nm vias and trenches in polymers", Appl. Phys. Lett., vol. 67, No. 21, Nov. 20, 1995, pp. 3114-3116.
Jan Haisma et al., "Mold-assisted nanolithography: A process for reliable pattern replication", J. Vac. Sci. Technol., vol. B 14, No. 6, pp. 4124-4128, Nov./Dec. 1996.
M. Colburn et al., "Step and Flash Imprint Lithography: A New Approach to High-Resolution Patterning", SPIE, vol. 3676, pp. 379-389, Mar. 1999.
Michael W. Lin et al., "Role of surfactants in adhesion reduction for step and flash imprint lithography", J. Micro/Nanolith. MEMS MOEMS, vol. 7, No. 3, pp. 033005-1 to 033005-8, Jul.-Sep. 2008.
International Search Report for PCT/JP2015/086164, dated Feb. 9, 2016 [PCT/ISA/210].

(Continued)

*Primary Examiner* — Tae H Yoon
(74) *Attorney, Agent, or Firm* — Sughrue Mion, PLLC

(57) ABSTRACT

Provided are a photocurable composition for imprints, having good releasability and temporal stability of the releasability, a pattern forming method, and a method for manufacturing a device. This photocurable composition for imprints includes a monofunctional chained aliphatic (meth)acrylate (A1) not containing a fluorine atom, a bifunctional or higher polyfunctional (meth)acrylate (A2) not containing a fluorine atom, a monofunctional (meth)acrylate (B) containing a fluorine atom, a photopolymerization initiator (C), and a non-polymerizable compound (D) having a polyoxyalkylene structure in a proportion of 1% to 5% by mass, in which the monofunctional chained aliphatic (meth)acrylate (A1) not containing a fluorine atom has a boiling point of 100° C. to 200° C. at a pressure of 0.67 kPa, and the monofunctional (meth)acrylate (B) containing a fluorine atom has a boiling point of 100° C. to 200° C. at a pressure of 0.67 kPa.

14 Claims, No Drawings

(56) References Cited

U.S. PATENT DOCUMENTS

2014/0374884 A1    12/2014    Kitagawa et al.

FOREIGN PATENT DOCUMENTS

| JP | 2010-239121 A | 10/2010 |
|---|---|---|
| JP | 2010-258026 A | 11/2010 |
| JP | 2010-287793 A | 12/2010 |
| JP | 2010-541193 A | 12/2010 |
| JP | 2012-079782 A | 4/2012 |
| JP | 2013-036027 A | 2/2013 |
| JP | 2013-149884 A | 8/2013 |
| JP | 2013-189537 A | 9/2013 |
| KR | 10-2009-0006066 A | 1/2009 |
| WO | 2006/114958 A1 | 11/2006 |
| WO | 2014/017328 | 7/2012 |

OTHER PUBLICATIONS

Written Opinion for PCT/JP2015/086164, dated Feb. 9, 2016 [PCT/ISA/237].

International Preliminary Report on Patentability from the International Bureau in counterpart International Application No. PCT/JP2015/086164, dated Jul. 6, 2017.

Communication dated Apr. 24, 2018 in Japanese Application No. 2016-566485.

Office Action dated Aug. 28, 2018 from the Korean Intellectual Property Office in counterpart Korean Application No. 10-2017-7015609.

Notification of Reason for Refusal dated Dec. 26, 2018 from the Korean Intellectual Property Office in KR Application No. 10-2017-7015609.

* cited by examiner

PHOTOCURABLE COMPOSITION FOR IMPRINTS, PATTERN FORMING METHOD, AND METHOD FOR MANUFACTURING DEVICE

CROSS-REFERENCE TO RELATED APPLICATIONS

This application is a Continuation of PCT International Application No. PCT/JP2015/086164 filed on Dec. 25, 2015, which claims priority under 35 U.S.C § 119(a) to Japanese Patent Application No. 2014-261756 filed on Dec. 25, 2014. Each of the above application(s) is hereby expressly incorporated by reference, in its entirety, into the present application.

BACKGROUND OF THE INVENTION

1. Field of the Invention

The present invention relates to a photocurable composition for imprints, a pattern forming method, and a method for manufacturing a device. More specifically, the present invention relates to a photocurable composition for imprints, used for forming a pattern using light irradiation, which is used in the manufacture of recording media such as a semiconductor integrated circuit, a microelectromechanical system (MEMS), an optical disc, and a magnetic disc, light receiving elements such as a solid-state imaging device, light emitting elements such as a light emitting diode (LED) and an organic electroluminescence (organic EL), optical devices such as a liquid crystal display device (LCD), optical members such as a grating, a relief hologram, an optical waveguide, an optical filter, and a microlens array, members for flat panel display, such as a thin-film transistor, an organic transistor, a color filter, an antireflection film, a polarizing element, an optical film, and a column material, a nanobio device, an immunoassay chip, a deoxyribonucleic acid (DNA) separation chip, a microreactor, a photonic liquid crystal, guide patterns for micropattern formation (directed self-assembly, DSA) using self-organization of block copolymers, and the like; a pattern forming method; and a pattern.

2. Description of the Related Art

An imprint method is a method developed from embossing technology well-known in the manufacture of an optical disc, which includes accurately transferring micropatterns of a mold prototype having an uneven pattern formed thereon (which is generally referred to as a mold, a stamper, or a template). Once a mold is prepared, microstructures such as nanostructures can then be simply and repeatedly molded, and therefore, the method is economical and is expected to be applicable to various recent fields.

As the imprint method, a thermal imprint method using a thermoplastic resin as the material to be processed (see, for example, S. Chou et al., Appl. Phys. Lett. 67, 3114 (1995)) and a photoimprint method using a photocurable composition (see, for example, J. Haisma et al., J. Vac. Sci. Technol. B 14(6), 4124 (1996) and M. Colbun et al., Proc. SPIE 3676, 379 (1999)) have been proposed. The thermal imprint method is a method in which a mold is pressed against a thermoplastic resin which has been heated to the glass transition temperature thereof or higher, and subsequently, the thermoplastic resin is cooled to the glass transition temperature or lower, and then the mold is released to transfer a microstructure onto the resin.

On the other hand, the photoimprint method is a method in which a photocurable composition is cured under irradiation with light through a translucent mold or a translucent substrate, and the mold is released to transfer a micropattern onto a photocured product. Since the method can provide imprints at room temperature, it can be applied to a precision machining field for ultramicropatterns, such as the manufacture of semiconductor integrated circuits.

However, since the photoimprint method has a step of releasing the mold, there has been a problem in the releasability of the mold since the beginning. As an attempt to improve the releasability of a mold, a method in which a fluorine-containing compound is incorporated into a curable composition is well-known (JP2006-114882A, WO2006/114958A, JP2008-95037A, JP2010-258026A, JP2010-239121A, JP2010-45163A, and M. W. Lin et al., J. Micro/Nanolith. MEMS MOEMS 7(3), 033005 (2008)).

SUMMARY OF THE INVENTION

As one of methods for applying a photocurable composition for imprints onto a substrate or a mold, there is an ink jet method. Since the ink jet method can adjust the amount of the photocurable composition to be applied according to the density of patterns, the unevenness in the thickness of the remaining film can be reduced, and thus, there is an advantage that pattern transfer properties become excellent in an etching process. In addition, as compared with a spin coating method, the efficiency of material use is high, and thus, there are advantages of reductions in the production costs and the environmental load.

Meanwhile, in the ink jet method, the photocurable composition may be placed in a tank such as an ink jet cartridge in a long-term storage state. According to the studies of the present inventors, it could be seen that a photocurable composition which has been stored in an ink jet cartridge for a long period of time may have a deterioration in the releasability in some cases.

Therefore, it is an object of the present invention to provide a photocurable composition for imprints having a good releasability and temporal stability of releasability, a pattern forming method, and a method for manufacturing a device.

The present inventors have conducted extensive studies, and as a result, they have found that the objects can be accomplished by using a specific monofunctional (meth) acrylate which will be described later, thereby leading to the completion of the present invention. The present invention provides the following aspects.

<1> A photocurable composition for imprints, comprising:

a monofunctional chained aliphatic (meth)acrylate (A1) not containing a fluorine atom;

a bifunctional or higher polyfunctional (meth)acrylate (A2) not containing a fluorine atom;

a monofunctional (meth)acrylate (B) containing a fluorine atom; and a photopolymerization initiator (C), in which the monofunctional chained aliphatic (meth) acrylate (A1) not containing a fluorine atom has a boiling point of 100° C. to 200° C. at a pressure of 0.67 kPa, and the monofunctional (meth)acrylate (B) containing a fluorine atom has a boiling point of 100° C. to 200° C. at a pressure of 0.67 kPa.

<2> The photocurable composition for imprints as described in <1>, in which the monofunctional chained aliphatic (meth)acrylate (A1) not containing a fluorine atom is an ester of a linear or branched aliphatic alcohol having 9 to 16 carbon atoms and a (meth)acrylic acid.

<3> The photocurable composition for imprints as described in <1> or <2>, in which the monofunctional (meth)acrylate (B) containing a fluorine atom is represented by the following General Formula (I),

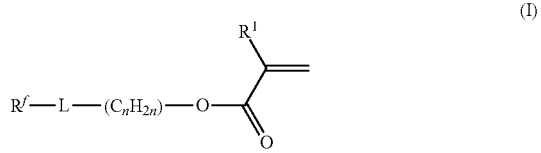

in the formula, $R^f$ represents a fluorine-containing alkyl group having 1 to 9 carbon atoms, in which at least one of the hydrogen atoms of the alkyl group is substituted with a fluorine atom, L represents a single bond, —O—, —OC(=O)—, or —C(=O)O—, $R^1$ represents a hydrogen atom or a methyl group, and n is an integer of 1 to 8, and in a case where L is a single bond, n represents an integer of 3 to 8.

<4> The photocurable composition for imprints as described in <3>, in which in General Formula (I), $R^f$ represents a fluorine-containing alkyl group having 1 to 9 carbon atoms, with 40% to 100% of the hydrogen atoms in the alkyl group being substituted with fluorine atoms.

<5> The photocurable composition for imprints as described in <3>, in which in General Formula (I), $R^f$ represents a group formed of a perfluoroalkyl group having 4 to 6 carbon atoms and an alkylene group having 1 to 3 carbon atoms.

<6> The photocurable composition for imprints as described in any one of <1> to <5>, in which the monofunctional chained aliphatic (meth)acrylate (A1) not containing a fluorine atom is included in the proportion of 10% to 40% by mass.

<7> The photocurable composition for imprints as described in any one of <1> to <6>, in which the monofunctional (meth)acrylate (B) containing a fluorine atom is included in the proportion of 1% to 5% by mass.

<8> The photocurable composition for imprints as described in any one of <1> to <7>, further comprising a non-polymerizable compound (D) having a polyoxyalkylene structure in the proportion of 1% to 5% by mass.

<9> The photocurable composition for imprints as described in any one of <1> to <8>, having a viscosity of 5 to 12 mPa·s and a surface tension of 27 to 33 mN/m at 23° C.

<10> The photocurable composition for imprints as described in any one of <1> to <9>, which is for use in ink jet.

<11> A pattern forming method comprising:
a step of applying the photocurable composition for imprints as described in any one of <1> to <10> onto a substrate or a mold having a pattern;
a step of sandwiching the photocurable composition for imprints between the mold and the substrate;
a step of irradiating the photocurable composition for imprints with light in a state where the photocurable composition for imprints is sandwiched between the mold and the substrate to cure the photocurable composition for imprints; and
a step of releasing the mold.

<12> The pattern forming method as described in <11>, in which the photocurable composition for imprints is applied onto the substrate or the mold having a pattern by an ink jet method.

<13> A method for manufacturing a device, comprising a step of etching the substrate, using a pattern prepared by the pattern forming method as described in <11> or <12> as a mask.

According to the present invention, it is possible to provide a photocurable composition having a good releasability and temporal stability of releasability, a pattern forming method, and a method for manufacturing a device.

DESCRIPTION OF THE PREFERRED EMBODIMENTS

Hereinafter, the contents of the present invention will be described in detail. The descriptions of the constituent elements described below are based on representative embodiments of the present invention, but the present invention is not limited to such embodiments.

A range of "to" in the present specification represents a range from a lower limit value to an upper limit value, unless otherwise specified.

In the present specification, "(meth)acrylate" represents acrylate and methacrylate, "(meth)acryl" represents acryl and methacryl, and "(meth)acryloyl" represents acryloyl and methacryloyl.

In the present specification, an "imprint" preferably refers to a pattern transfer of 1 nm to 100 nm in size, or more preferably a pattern transfer of 10 nm to 1 μm in size (nanoimprint).

In citations for a group (atomic group) in the present specification, a group which is denoted without specifying whether it is substituted or unsubstituted encompasses both of a group not having a substituent and a group having a substituent. For example, an "alkyl group" includes not only an alkyl group not having a substituent (unsubstituted alkyl group), but also an alkyl group having a substituent (substituted alkyl group).

In the present specification, "light" encompasses not only those having wavelengths falling within the ranges of ultraviolet rays, near-ultraviolet rays, far-ultraviolet rays, visible rays, infrared rays, and the like, and electromagnetic waves, but also radiation. Examples of radiation include microwaves, electron beams, extreme ultraviolet rays (EUV), and X-rays. Further, it is possible to use laser light such as 248-nm excimer laser, 193-nm excimer laser, and 172-nm excimer laser. These types of light may use monochromatic light (single wavelength light) that has passed through an optical filter, or may be light (composite light) having a plurality of different wavelengths.

In the present specification, a solid content refers to the total mass of the components excluding a solvent from the total composition of a composition.

<Photocurable Composition for Imprints>

The photocurable composition for imprints of the present invention (hereinafter also simply referred to as "the curable composition of the present invention" in some cases) includes a monofunctional chained aliphatic (meth)acrylate (A1) not containing a fluorine atom, a bifunctional or higher polyfunctional (meth)acrylate (A2) not containing a fluorine atom, a monofunctional (meth)acrylate (B) containing a fluorine atom, and a photopolymerization initiator (C), in which the monofunctional chained aliphatic (meth)acrylate (A1) not containing a fluorine atom has a boiling point of 100° C. to 200° C. at a pressure of 0.67 kPa, and the monofunctional (meth)acrylate (B) containing a fluorine atom has a boiling point of 100° C. to 200° C. at a pressure of 0.67 kPa.

Hereinafter the "monofunctional chained aliphatic (meth)acrylate (A1) not containing a fluorine atom" is also referred to as the "monofunctional (meth)acrylate (A1)". Further, the "bifunctional or higher polyfunctional (meth)acrylate (A2) not containing a fluorine atom" is also referred to as the "polyfunctional (meth)acrylate (A2)". Further, the monofunctional (meth)acrylate (B) containing a fluorine atom is also referred to as the "fluorine-containing (meth)acrylate (B)".

The curable composition of the present invention has good releasability and temporal stability of releasability. The reasons therefor are presumed as follows.

Since the curable composition of the present invention can reduce the modulus of elasticity of a cured film due to the incorporation of the monofunctional (meth)acrylate (A1), the releasability is excellent.

Since the curable composition of the present invention can appropriately lower the surface tension of the composition of the fluorine-containing (meth)acrylate (B), the releasability is excellent.

As described above, in the ink jet method, a curable composition is jetted from a nozzle head of an ink jet coating device onto a substrate or a mold, but the curable composition may be placed in a state where the curable composition is stored for a long period of time depending on the use conditions in some cases. Since the monofunctional (meth)acrylate (A1) and the fluorine-containing (meth)acrylate (B) used in the curable composition of the present invention each have a boiling point of 100° C. to 200° C. at a pressure of 0.67 kPa, they are difficult to volatilize even in a case of being stored in a tank for a long period of time. Incidentally, since the polyfunctional (meth)acrylate (A2) has a relatively high boiling point, it is difficult to volatilize. As a result, it is considered that the curable composition of the present invention has little variation in the monomer composition during the storage, and thus, the temporal stability of releasability can be improved.

Furthermore, since the viscosity of the composition is low due to the incorporation of the monofunctional (meth)acrylate (A1), the ink jet jetting accuracy is excellent. Incidentally, since the variation in the monomer composition during the storage is little, the variation in the viscosity or surface tension of the composition can be suppressed, and thus, the temporal stability in the ink jet jetting accuracy is also excellent.

Hereinafter the respective components of the curable composition of the present invention will be described.

<<Monofunctional (Meth)Acrylate (A1)>>

The curable composition of the present invention includes a monofunctional (meth)acrylate (A1).

The monofunctional (meth)acrylate (A1) is a monofunctional chained aliphatic (meth)acrylate not containing a fluorine atom, and has a boiling point of 100° C. to 200° C. at a pressure of 0.67 kPa. If the boiling point at a pressure of 0.67 kPa is 100° C. or higher, the volatilization of the monofunctional (meth)acrylate (A1) can be suppressed. If the boiling point at a pressure of 0.67 kPa is 200° C. or lower, purification by distillation can be easily carried out, and thus, the monofunctional (meth)acrylate (A1) having a high purity can be produced with high productivity.

The boiling point at a pressure of 0.67 kPa of the monofunctional (meth)acrylate (A1) is more preferably 110° C. to 180° C., and still more preferably 120° C. to 160° C.

In addition, in the present invention, a "chained aliphatic (meth)acrylate" means a linear or branched aliphatic (meth)acrylate not including an aromatic structure, an alicyclic hydrocarbon structure, and a heterocyclic structure.

The monofunctional (meth)acrylate (A1) is preferably an ester of a linear or branched aliphatic alcohol having 9 to 16 carbon atoms and a (meth)acrylic acid.

The molecular weight of the monofunctional (meth)acrylate (A1) is preferably 195 to 315, more preferably 210 to 285, and still more preferably 225 to 270.

Specific examples of the monofunctional (meth)acrylate (A1) include n-nonyl (meth)acrylate, i-nonyl (meth)acrylate, n-decyl (meth)acrylate, i-decyl (meth)acrylate, 2-propylheptyl (meth)acrylate, n-undecyl (meth)acrylate, n-dodecyl (meth)acrylate, 2-butyloctyl (meth)acrylate, n-tridecyl (meth)acrylate, n-tetradecyl (meth)acrylate, and n-hexadecyl (meth)acrylate. Among these, n-decyl acrylate, 2-propylheptyl acrylate, n-undecyl acrylate, n-dodecyl acrylate, 2-butyloctyl acrylate, n-tridecyl acrylate, and n-tetradecyl acrylate are more preferable, n-undecyl acrylate, n-dodecyl acrylate, 2-butyloctyl acrylate, n-tridecyl acrylate, and n-tetradecyl acrylate are still more preferable, and n-dodecyl acrylate or 2-butyloctyl acrylate are particularly preferable.

The monofunctional (meth)acrylate (A1) is included in the proportion of 10% to 40% by mass in the curable composition of the present invention. The lower limit is more preferably 15% by mass or more. The upper limit is more preferably 35% by mass or less. If the content of the monofunctional (meth)acrylate (A1) is set to 10% by mass or more, the ink jet jetting accuracy and the mold releasability can be improved. Further, if the content of the monofunctional (meth)acrylate (A1) is set to 40% by mass or less, a pattern having an excellent film strength is obtained. The monofunctional (meth)acrylate (A1) may be used singly or in combination of two or more kinds thereof. In a case where two or more kinds are used, it is preferable that the total amount is within the range.

<<Polyfunctional (Meth)Acrylate (A2)>>

The curable composition of the present invention includes a polyfunctional (meth)acrylate (A2).

The polyfunctional (meth)acrylate (A2) is a bifunctional or higher polyfunctional (meth)acrylate not containing a fluorine atom. The boiling point at a pressure of 0.67 kPa of the polyfunctional (meth)acrylate (A2) is preferably 90° C. or higher, more preferably 100° C. or higher, and still more preferably 110° C. or higher.

As the polyfunctional (meth)acrylate (A2), an ester of an aliphatic polyhydric alcohol or an aromatic polyhydric alcohol and a (meth)acrylic acid is preferable.

The number of (meth)acrylate groups contained in the polyfunctional (meth)acrylate (A2) is more preferably 2 to 6, still more preferably 2 or 3, and most preferably 2.

The polyfunctional (meth)acrylate (A2) preferably includes a (meth)acrylate (A2-1) having an aromatic structure and/or an alicyclic hydrocarbon structure.

The polyfunctional (meth)acrylate (A2) may only be composed of a (meth)acrylate (A2-1) having an aromatic structure and/or an alicyclic hydrocarbon structure, or may also be composed of a (meth)acrylate (A2-1) having an aromatic structure and/or an alicyclic hydrocarbon structure and a chained aliphatic polyfunctional (meth)acrylate (A2-2) having neither an aromatic structure nor an alicyclic hydrocarbon structure.

Specific examples of the polyfunctional (meth)acrylate (A2-1) include o-, m-, or p-phenylene di(meth)acrylate, o-, m-, or p-xylylene di(meth)acrylate, bisphenol A di(meth)acrylate, EO-modified bisphenol A di(meth)acrylate, PO-modified bisphenol A di(meth)acrylate, EO-modified bisphenol F di(meth)acrylate, 9,9-bis[4-(2-(meth)acryloyloxyethoxy)phenyl]fluorene, cyclohexanediol di(meth)acrylate, cyclohexanedimethanol di(meth)acrylate, norbonanedimethanol di(meth)acrylate, tricyclodecanedimethanol di(meth)acrylate, and 1,3-adamantanediol di(meth)acrylate.

Among these, m-xylylene diacrylate, cyclohexanedimethanol diacrylate, or tricyclodecanedimethanol diacrylate is particularly suitably used in the present invention.

Specific examples of the polyfunctional (meth)acrylate (A2-2) include ethylene glycol di(meth)acrylate, 1,3-butanediol di(meth)acrylate, 1,4-butanediol di(meth)acrylate, neopentyl glycol di(meth)acrylate, 1,6-hexanediol di(meth)acrylate, 3-methyl-1,5-pentanediol di(meth)acrylate, 1,9-nonanediol di(meth)acrylate, 2-butyl-2-ethyl-1,3-propanediol di(meth)acrylate, 1,10-decanediol di(meth)acrylate, diethylene glycol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, polypropylene glycol di(meth)acrylate, polytetramethylene glycol di(meth)acrylate, EO-modified neopentyl glycol di(meth)acrylate, PO-modified neopentyl glycol di(meth)acrylate, 2,2-dimethyl-3-((meth)acryloyloxy)propyl 2,2-dimethyl-3-((meth)acryloyloxy)propionate, 2-hydroxy-3-acryloyloxypropylmethacrylate, trimethylolpropane tri(meth)acrylate, ditrimethylolpropane tetra(meth)acrylate, pentaerythritol tri(meth)acrylate, pentaerythritol tetra(meth)acrylate, dipentaerythritol hexa(meth)acrylate, and tris(2-(meth)acryloyloxyethyl) isocyanurate.

Among these, 1,3-butanediol diacrylate, 1,4-butanediol diacrylate, neopentyl glycol diacrylate, 1,6-hexanediol diacrylate, 3-methyl-1,5-pentanediol diacrylate, and 2-butyl-2-ethyl-1,3-propanediol diacrylate are particularly suitably used in the present invention.

The molecular weight of the polyfunctional (meth)acrylate (A2) is preferably 170 to 600, more preferably 190 to 300, and still more preferably 210 to 270. If the molecular weight is within the range, suppression of the volatilization and low viscosity can both be achieved.

The polyfunctional (meth)acrylate (A2) is preferably included in the proportion of 40% to 89% by mass in the curable composition of the present invention. The lower limit is more preferably 50% by mass or more. The upper limit is more preferably 75% by mass or less. If the content of the polyfunctional (meth)acrylate (A2) is within the range, a pattern having excellent film strength is obtained.

The mass ratio of the monofunctional (meth)acrylate (A1) to the polyfunctional (meth)acrylate (A2) is preferably 10:90 to 40:60, more preferably 15:85 to 35:55, and still more preferably 20:80 to 30:70. By setting the mass ratio to fall within such a range, the ink jetting accuracy, the mold chargeability, the curability, the releasability, the strength of a cured film, and the etching resistance can be improved.

The polyfunctional (meth)acrylate (A2) may be used singly or in combination of two or more kinds thereof. In a case where two or more kinds thereof are used, it is preferable that the total amount is within the range.

<<Fluorine-Containing (Meth)Acrylate (B)>>

The curable composition of the present invention includes a monofunctional (meth)acrylate (B) containing a fluorine atom.

In the present invention, the fluorine-containing (meth)acrylate (B) having a boiling point of 100° C. to 200° C. at a pressure of 0.67 kPa is used. If the boiling point at a pressure of 0.67 kPa is 100° C. or higher, the volatilization of the fluorine-containing (meth)acrylate (B) during the storage can be suppressed. If the boiling point at a pressure of 0.67 kPa is 200° C. or lower, purification by distillation can easily be carried out, and thus the fluorine-containing (meth)acrylate (B) having a high purity can be produced with high productivity.

The boiling point at a pressure of 0.67 kPa of the fluorine-containing (meth)acrylate (B) is more preferably 100° C. to 180° C., and still more preferably 100° C. to 160° C.

The molecular weight of the fluorine-containing (meth)acrylate (B) is preferably 430 to 600, more preferably 440 to 550, and still more preferably 450 to 500.

The fluorine-containing (meth)acrylate (B) having the boiling point can be preferably used, and is preferably a fluorine-containing (meth)acrylate represented by the following General Formula (I),

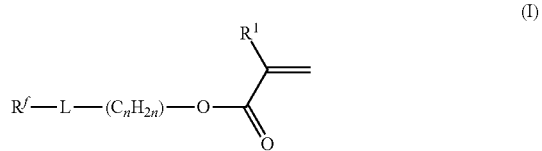

in the formula, $R^f$ represents a fluorine-containing alkyl group having 1 to 9 carbon atoms, in which at least one of the hydrogen atoms of the alkyl group is substituted with a fluorine atom, L represents a single bond, —O—, —OC(=O)—, or —C(=O)O—, $R^1$ represents a hydrogen atom or a methyl group, and n is an integer of 1 to 8, and in a case where L is a single bond, n represents an integer of 3 to 8.

In General Formula (I), $R^f$ represents a fluorine-containing alkyl group having 1 to 9 carbon atoms, in which at least one of the hydrogen atoms of the alkyl group is substituted with a fluorine atom. $R^f$ may be linear, branched, or cyclic groups, but is preferably linear or branched, and more preferably linear.

Furthermore, in the present specification, the "fluorine-containing alkyl group having 1 to 9 carbon atoms, in which at least one of the hydrogen atoms of the alkyl group is substituted with a fluorine atom" means an alkyl group having 1 to 9 carbon atoms, containing a fluorine atom as a substituent, and is not limited to groups synthesized by substituting a hydrogen atom of the alkyl group with a hydrogen atom.

The number of carbon atoms in $R^f$ is more preferably 2 to 9, still more preferably 4 to 9, even still more preferably 5 to 8, and particularly preferably 6 to 8.

The substitution rate of fluorine atoms in $R^f$ is preferably 40% to 100%, more preferably 50% to 90%, and still more preferably 65% to 85%. According to this aspect, the mold releasability can be improved. The substitution rate of fluorine atoms refers to a ratio (%) of the number of all the hydrogen atoms contained in an alkyl group having 1 to 9 carbon atoms, substituted with fluorine atoms.

$R^f$ is preferably a fluorine-containing alkyl group formed of a perfluoroalkyl group having 4 to 6 carbon atoms and an alkylene group having 1 to 3 carbon atoms, or a fluorine-containing alkyl group formed of a w-H-perfluoroalkyl group having 4 to 6 carbon atoms and an alkylene group having 1 to 3 carbon atoms, and more preferably a fluorine-containing alkyl group formed of a perfluoroalkyl group having 4 to 6 carbon atoms and an alkylene group having 1 to 3 carbon atoms.

Specific examples of $R^f$ include $CF_3CH_2$—, $CF_3CF_2CH_2$—, $CF_3(CF_2)_2CH_2$—, $CF_3(CF_2)_3CH_2CH_2$—, $CF_3(CF_2)_4CH_2CH_2CH_2$—, $CF_3(CF_2)_4CH_2$—, $CF_3(CF_2)_5CH_2CH_2$—, $CF_3(CF_2)_5CH_2CH_2CH_2$—, $(CF_3)_2CH$—, $(CF_3)_2C(CH_3)CH_2$—, $(CF_3)_2CF(CF_2)_2CH_2CH_2$—, $(CF_3)_2CF(CF_2)_4CH_2CH_2$—, $H(CF_2)_2CH_2$—, $H(CF_2)_4CH_2$—, $H(CF_2)_6CH_2$—, and $H(CF_2)_8CH_2$—. Among these, $CF_3(CF_2)_4CH_2$—, $CF_3(CF_2)_5CH_2$—, $CF_3(CF_2)_5CH_2CH_2$—, $CF_3(CF_2)_5CH_2CH_2CH_2$—, and $H(CF_2)_6CH_2$— are more preferable, $CF_3(CF_2)_5CH_2CH_2$— or $CF_3(CF_2)_5CH_2CH_2CH_2$— is still more preferable, and $CF_3(CF_2)_5CH_2CH_2$— is particularly preferable.

In General Formula (I), L represents a single bond, —O—, —OC(=O)—, or —C(=O)O—, and is more preferably —O— or —OC(=O)—, and most preferably —O—.

In General Formula (I), $R^1$ represents a hydrogen atom or a methyl group. From the viewpoint of the reactivity, $R^1$ is preferably a hydrogen atom.

In General Formula (I), n is an integer of 1 to 8, and in a case where L is a single bond, n represents an integer of 3 to 8.

In a case where L is —O—, —OC(=O)—, or —C(=O)O—, n is preferably 1 to 5, and more preferably 1 to 3. In a case where L is a single bond, n is preferably 3 to 7, and more preferably 3 to 5. By setting n to fall within the range, the boiling point at a pressure of 0.67 kPa can be adjusted to 100° C. to 200° C.

Specific preferred examples of the fluorine-containing (meth)acrylate (B) include the following compounds, but are not limited to these compounds.

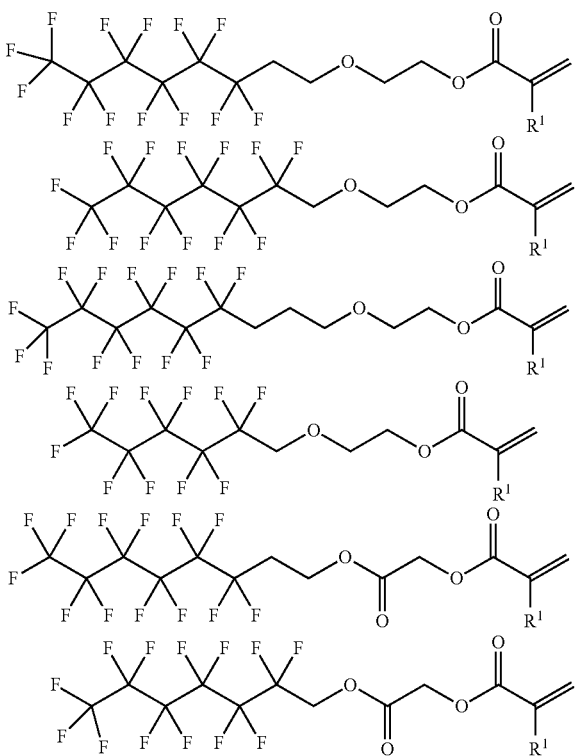

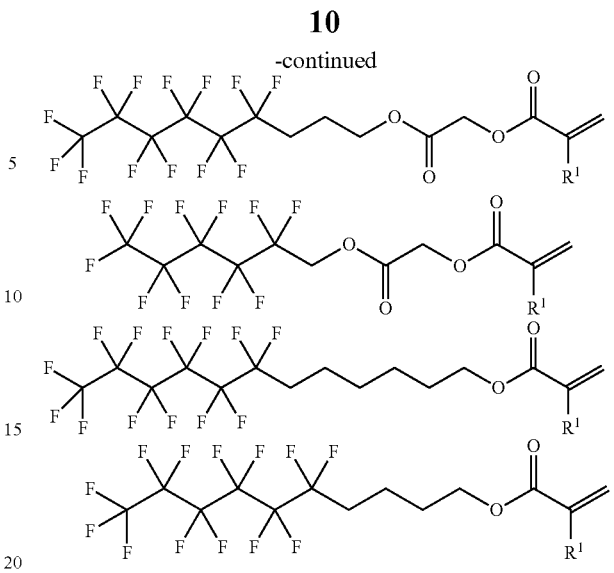

The fluorine-containing (meth)acrylate (B) is included in the proportion of preferably 1% to 5% by mass, and more preferably 1% to 3% by mass in the curable composition of the present invention. If the content of the fluorine-containing (meth)acrylate (B) is set to 1% by mass or more, the releasability is further improved. Further, if the content of the fluorine-containing (meth)acrylate (B) is set to 5% by mass or less, the roughness of the pattern becomes excellent. The fluorine-containing (meth)acrylate (B) may be used singly or in combination of two or more kinds thereof. In a case where two or more kinds are used, it is preferable that the total amount is within the range.

Furthermore, the content of the fluorine-containing (meth)acrylate (B) is preferably 1% to 10% by mass, more preferably 1% to 7% by mass, and still more preferably 1% to 4% by mass, with respect to the total content of the monofunctional (meth)acrylate (A1) and the polyfunctional (meth)acrylate (A2). By setting the content to fall within such a range, the surface tension of the composition can be adjusted to an appropriate value.

<<Other Polymerizable Compounds>>

The curable composition of the present invention includes polymerizable compounds (also referred to as other polymerizable compounds) other than the monofunctional (meth)acrylate (A1), the polyfunctional (meth)acrylate (A2), and the fluorine-containing (meth)acrylate (B) as described above.

Examples thereof include an epoxy compound, an oxetane compound, a vinyl ether compound, a styrene derivative, propenyl ether, and butenyl ether. Specific examples thereof include those described in paragraph Nos. 0020 to 0098 of JP2011-231308A, and these contents are incorporated in the present specification.

Moreover, the curable composition may further include a monofunctional (meth)acrylate having an aromatic structure or an alicyclic hydrocarbon structure. Examples of the monofunctional (meth)acrylate having an aromatic structure or an alicyclic hydrocarbon structure include benzyl (meth)acrylate, 2-phenoxyethyl (meth)acrylate, benzyl (meth)acrylate having a substituent on an aromatic ring (preferred examples of the substituent include an alkyl group having 1 to 6 carbon atoms, an alkoxy group having 1 to 6 carbon atoms, and a cyano group), 1- or 2-naphthyl (meth)acrylate, 1- or 2-naphthylmethyl (meth)acrylate, 1- or 2-naphthylethyl (meth)acrylate, isobornyl (meth)acrylate, dicyclopentanyl (meth)acrylate, dicyclopentanyloxyethyl (meth)acrylate, and adamantyl (meth)acrylate. Among these, benzyl acrylate having a linear or branched alkyl group having 3 to 6 carbon atoms on an aromatic ring, or 2-naphthylmethyl acrylate is particularly suitable.

In a case where the curable composition of the present invention includes other polymerizable compounds, the content of such other polymerizable compounds is preferably 5% to 40% by mass, and more preferably 10% to 30% by mass.

In addition, the curable composition of the present invention can also have the composition substantially not including other polymerizable compounds. "Substantially not including other polymerizable compounds" indicates that other polymerizable compounds are not intentionally added.

<Photopolymerization Initiator (C)>

The curable composition of the present invention includes a photopolymerization initiator. Any of the photopolymerization initiators can be used as long as they are compounds that generate active species capable of polymerizing polymerizable compounds by irradiation with light. As the photopolymerization initiator, a radical polymerization initiator and a cationic polymerization initiator are preferable, and a radical polymerization initiator is more preferable.

As the radical photopolymerization initiator, for example, a commercially available initiator can be used. As these examples, for example, those described in paragraph No. 0091 of JP2008-105414 can be preferably adopted and used. Among these, acetophenone-based compounds, acylphosphine oxide-based compounds, and oxime ester-based compounds are preferable from the viewpoints of curing sensitivity and absorption characteristics. Examples of the commercially available product include IRGACURE (registered trademark) 1173, IRGACURE 184, IRGACURE 2959, IRGACURE 127, IRGACURE 907, IRGACURE 369, IRGACURE 379, LUCIRIN (registered trademark) TPO, IRGACURE 819, IRGACURE OXE01, IRGACURE OXE02, IRGACURE 651, and IRGACURE 754 (all manufactured by BASF).

The photopolymerization initiators are used singly, but are preferably used in combination of two or more kinds thereof. In a case of using them in combination of two or more kinds thereof, it is preferable that two or more kinds of radical polymerization initiators are used in combination. Specific examples thereof include a combination of IRGACURE 1173 and IRGACURE 907, a combination of IRGACURE 1173 and LUCIRIN TPO, a combination of IRGACURE 1173 and IRGACURE 819, a combination of IRGACURE 1173 and IRGACURE OXE01, a combination of IRGACURE 907 and LUCIRIN TPO, and a combination of IRGACURE 907 and IRGACURE 819. By using such combinations, an exposure margin can be expanded.

In a case of using the photopolymerization initiators in combination of two or more kinds thereof, the preferred proportion (mass ratio) is preferably 9:1 to 1:9, more preferably 8:2 to 2:8, and still more preferably 7:3 to 3:7.

The content of the photopolymerization initiator is preferably 0.1% to 15% by mass, more preferably 0.5% to 10% by mass, and still more preferably 1% to 5% by mass, with respect to the curable composition. The curable composition may include one kind or two or more kinds of the photopolymerization initiator. In a case of including two or more kinds of the photopolymerization initiator, it is preferable that the total amount thereof is within the range. If the content of the photopolymerization initiator is set to 0.1% by mass or more, the sensitivity (rapid curability), the resolution, the properties of the line edge roughness, and the film strength tend to be further improved, which is thus preferable. In addition, if the content of the photopolymerization initiator is set to 15% by mass or less, the translucency, the coloring properties, the handling properties, and the like are improved, which is thus preferable.

<<Non-Polymerizable Compound (D) Having Polyoxyalkylene Structure>>

It is preferable that the curable composition of the present invention includes a non-polymerizable compound (D) having a polyoxyalkylene structure in order to improve the releasability. Here, the non-polymerizable compound refers to a compound not having a polymerizable group.

As the polyoxyalkylene structure, a polyoxyethylene structure, a polyoxypropylene structure, a polyoxybutylene structure, or a mixed structure thereof is more preferable, a polyoxyethylene structure or a polyoxypropylene structure is still more preferable, and a polyoxypropylene structure is particularly preferable. Further, a branched structure having a polyhydric alcohol such as glycerin and pentaerythritol as a core is also preferable.

As the polyoxyalkylene structure, those having 3 to 30 polyoxyalkylene structural units are preferable, those having 5 to 20 polyoxyalkylene structural units are more preferable, those having 7 to 15 polyoxyalkylene structural units are still more preferable, and those having 9 to 13 polyoxyalkylene structural units are particularly preferable.

The hydroxyl groups at the end of the polyoxyalkylene structure may not be substituted, at least one of the groups may be substituted with an organic group, or all of the groups may be substituted with organic groups. The organic group is preferably an organic group having 1 to 20 carbon atoms, and may have an oxygen atom, a fluorine atom, or a silicon atom, but it is preferable that the organic group does not have a fluorine atom or a silicon atom. It is preferable that the organic group is connected to a polyoxyalkylene structure via an ether bond, an ester bond, or a divalent linking group. Specific examples of the organic group include hydrocarbon groups such as a methyl group, an ethyl group, a butyl group, an octyl group, a benzyl group, and a phenyl group, fluorine-containing alkyl groups, fluorine-containing alkyl ether groups, and polysiloxane groups.

The number-average molecular weight of the non-polymerizable compound (D) is preferably 300 to 3,000, more preferably 400 to 2,000, and still more preferably 500 to 1,500.

Specific examples of the non-polymerizable compound (D) include ethylene oxide adducts (for example, OLFINE E1004, E1010, E1020, and the like manufactured by Nissin Chemical Co., Ltd., and SURFYNOL 420, 440, 465, 485, 2502, 2505, and the like manufactured by Air Products and Chemicals, Inc.) such as polyoxyethylene (also referred to as polyethylene glycol), polyoxypropylene (also referred to as polypropylene glycol), polyoxybutylene, polyoxyethylene-.polyoxypropylene (block and random), polyoxyethylene (hereinafter abbreviated as PEG) glyceryl ether, polyoxypropylene (hereinafter abbreviated as PPG) glyceryl ether, PEG.PPG glyceryl ether, PEG bisphenol A ether, PEG trimethylolpropane ether, PEG pentaerythritol ether, PEG neopentyl glycol ether, PEG methyl ether, PEG butyl ether, PEG 2-ethylhexyl ether, PEG lauryl ether, PEG oleyl ether, PPG methyl ether, PPG butyl ether, PPG lauryl ether, PPG oleyl ether, PEG phenyl ether, PEG octylphenyl ether, PEG nonylphenyl ether, PEG naphthyl ether, PEG styrenated phenyl ether, PPG phenyl ether, PPG octylphenyl ether, PPG nonylphenyl ether, PEG dimethyl ether, PEG dibenzyl ether, PPG dimethyl ether, PPG dibenzyl ether, PEG.PPG dimethyl ether, PEG glyceryl ether trimethyl ether, PPG glyceryl ether trimethyl ether, PEG monoacetate, PEG monolaurate, PEG monooleate, PPG monoacetate, PPG monolaurate, PPG monooleate, PEG diacetate, PEG dilaurate, PEG dioleate, PPG diacetate, PPG dilaurate, PPG dioleate, PEG glycerin fatty acid ester, PEG sorbitan fatty acid ester, PEG sorbitol fatty acid ester, and 2,4,7,9-tetramethyl-5-decine-4,7-diol, and fluorine-containing compounds represented by the following General Formula (II).

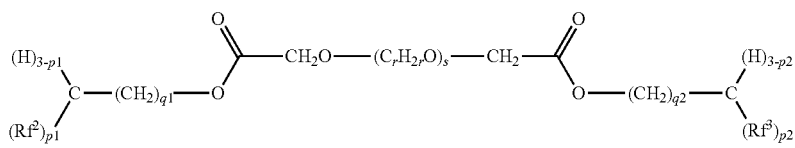

General Formula (II)

In General Formula (II), $Rf^2$ and $Rf^3$ each independently represent a fluorine-containing alkyl group having 1 to 6 carbon atoms, which contain two or more fluorine atoms; p1 and p2 each independently represent an integer of 1 to 3, q1 and q2 each independently represent an integer of 0 to 2, r represents an integer of 2 to 4, and s represents 6 to 20.

Preferred ranges of $Rf^2$ and $Rf^3$ in General Formula (II) are the same definitions as the preferred range of Rf in General Formula (I), and are also the same as the preferred ranges or the specific examples of $Rf^2$ and $Rf^3$.

In General Formula (II), p1 and p2 each independently represent an integer of 1 to 3, and is preferably 1 or 2, and more preferably 1.

q1 and q2 each independently represent an integer of 0 to 2, and is preferably 1 or 2, and more preferably 1.

r represents an integer of 2 to 4, and is preferably 2 or 3, and more preferably 2.

s represents 6 to 20, and is preferably 7 to 15, and more preferably 9 to 13.

With regard to the non-polymerizable compound (D), reference can be made to the descriptions in paragraph Nos. 0105 to 0106 of JP2013-036027A, the contents of which are incorporated herein.

The content of the non-polymerizable compound (D) is preferably 1% to 10% by mass in the entire composition excluding the solvent. The lower limit is more preferably 2% by mass or more. The upper limit is more preferably 8% by mass or less, still more preferably 6% by mass or less, and particularly preferably 4% by mass or less.

<<Polymerization Inhibitor>>

The curable composition of the present invention preferably includes a polymerization inhibitor. By incorporating an appropriate amount of the polymerization inhibitor having a content of the polymerization inhibitor of preferably 0.001% to 0.1% by mass, more preferably 0.005% to 0.08% by mass, and still more preferably 0.01% to 0.05% by mass, with respect to the mass of the entire polymerizable compound, a change in the viscosity over time can be suppressed while maintaining high curing sensitivity. The polymerization inhibitor may be added during the production of the entire polymerizable compound, or may be added to the curable composition of the present invention later. A specific example of the polymerization inhibitor includes 4-hydroxy-2,2,6,6-tetramethylpiperidin-1-oxy-free radicals. Further, specific examples of other polymerization inhibitors include those described in paragraph No. 0121 of JP2012-169462A, the contents of which are incorporated herein.

<Surfactant>

The curable composition of the present invention may include a surfactant, if desired. Generally, the surfactant refers to a material which has a hydrophobic moiety and a hydrophilic moiety within a molecule and distinctively changes the properties of an interface, only with a small amount of addition. The surfactant used in the present invention is a material which has a hydrophobic moiety and a hydrophilic moiety within a molecule, and distinctively reduces the surface tension of the composition only with a small amount of addition. For example, it is a material which reduces the surface tension of the curable composition from 40 mN/m down to 30 mN/m or less with an amount of addition of 1% by mass or less with respect to the curable composition. When the surfactant is incorporated into the curable composition of the present invention, an effect of improvement in the uniformity of the coating or improvement in the releasability can be expected.

The surfactant is preferably a nonionic surfactant, and is preferably a surfactant including at least one kind of a fluorine-based, Si-based, or fluorine-based/Si-based surfactant. The "fluorine-based/Si-based" used herein indicates that the surfactant meets the requirements of both fluorine-based and Si-based surfactants.

Examples of the nonionic fluorine-based surfactant include those under the trade names of FLUORAD (Sumitomo 3M Ltd.), MEGAFACE (DIC Corporation), SURFLON (AGC Seimi Chemical Co., Ltd.), UNIDYNE (Daikin Industries Ltd.), FTERGENT (NEOS Co., Ltd.), EFTOP (Mitsubishi Material Electronic Chemicals Co., Ltd.), POLYFLOW (Kyoeisha Chemical Co., Ltd.), KP (Shin-Etsu Chemical Co., Ltd.), TROYSOL (Troy Chemical Industries), PolyFox (OMNOVA Solutions Inc.), and Capstone (DuPont).

The content of the surfactant is, for example, preferably 0.01% to 5% by mass, more preferably 0.1% to 4% by mass, and still more preferably 1% to 3% by mass in the entire composition. The surfactant may be used singly or in combination of two or more kinds thereof. In a case of using two or more kinds of surfactant, the total amount thereof is within the range.

In the present invention, even in an aspect in which the surfactant is not substantially included, it is possible to achieve a low release force. Being not substantially included means that, for example, the content is preferably 0.001% by mass or less, and more preferably 0.0001% by mass or less, with respect to the total mass of the curable composition of the present invention.

<<Other Components>>

The curable composition of the present invention may also include, other than the components described above, a photosensitizer, an antioxidant, an ultraviolet absorber, a photostabilizer, an age resistor, a plasticizer, an adherence enhancer, a thermal polymerization initiator, a photobase generator, a colorant, inorganic particles, elastomer particles, a basic compound, a photoacid generator, a photoacid amplifier, a chain transfer agent, an antistatic agent, a fluidity modifier, an anti-foaming agent, a dispersant, and the like, if desired. Specific examples of such components include those described in paragraphs Nos. 0092 and 0093, and paragraphs Nos. 0113 to 0137 of JP2008-105414A, the contents of which are incorporated herein. Further, reference can be made to the pamphlets of WO2011/126101A and WO2013/051735A, and descriptions corresponding to JP2012-041521A and JP2013-093552A, the contents of which are incorporated herein.

<<Solvent>>

The curable composition of the present invention may include a solvent. The content of the solvent in the curable composition of the present invention is preferably 5% by mass or less, and more preferably 3% by mass or less, and particularly preferably, a solvent is not substantially contained. Here, not substantially including a solvent indicates that, for example, the content of the solvent is 1% by mass or less with respect to the total mass of the curable composition of the present invention. In a case where the curable composition of the present invention is applied onto a substrate by an ink jet method, a small amount of the solvent to be blended preferably makes it possible to suppress the change in viscosity of the composition due to volatilization of the solvent, which is thus preferable.

Although the curable composition of the present invention does not necessarily include a solvent, the solvent may be added arbitrarily at a time of finely controlling the viscosity of the composition, or in other cases. The type of a solvent that can be preferably used in the curable composition of the present invention is not particularly limited as long as it is a solvent that is generally used in a curable composition for photoimprints and photoresists, and may be any solvent capable of allowing therein to uniformly dissolve or disperse the compound used in the present invention, and not reacting with these components. Examples of the solvent that can be used in the present invention include those described in paragraph No. 0088 of JP2008-105414A, the contents of which are incorporated herein.

<Preparation Method and Use of Curable Composition>

The curable composition of the present invention can be prepared by mixing the respective components described above. Mixing of the respective components is usually carried out in a range of 0° C. to 100° C. Further, after mixing the respective components, the mixture is preferably filtered, for example, through a filter. The filtration may be carried out in multiple steps or may be repeated plural times. In addition, the filtered liquid may also be refiltered.

Any filter which has been used in the filtration applications from the related art can be used without particular limitation. Examples of the filter include fluorine resins such as polytetrafluoroethylene (PTFE), polyamide-based resins such as nylon-6 and nylon 6,6, and polyolefin resins (including high-density polyolefin and ultrahigh-molecular-weight polyolefin) such as polyethylene and polypropylene (PP). Among these materials, polypropylene (including high-density polypropylene) and nylon are preferable.

The pore diameter of the filter is suitably, for example, approximately 0.003 to 5.0 µm. By setting the pore diameter to fall within such a range, it is possible to reliably remove impurities and aggregations included in the composition, while suppressing filtration clogging.

When using a filter, different filters may be combined. At this time, the filtration with the first filter may be performed once or may also be performed two or more times. In a case of performing filtration twice or more times through a combination of different filters, the pore diameter at the second run or later is preferably the same as or smaller than that of the first filtration run. Further, the first filter having different pore diameters may be combined within the above-mentioned range. For the pore diameter as mentioned herein, reference can be made to a nominal value of a filter maker. As a commercially available filter, a filter can be selected from various filters provided by, for example, Nihon Pall Ltd., Advantec Toyo Kaisha, Ltd., Nihon Entegris K. K (formerly Nihon Mykrolis Corporation), Kitz Micro Filter Corporation, and the like.

The curable composition of the present invention preferably has a viscosity at 23° C. of 5 to 12 mPa·s. The lower limit, for example, is more preferably 6 mPa·s or more. The upper limit, for example, is more preferably 10 mPa·s or less, and still more preferably 8 mPa·s or less. By setting the viscosity to fall within the range, the ink jet jetting accuracy or the chargeability into uneven patterns of a mold can be improved. Incidentally, the value of the viscosity in the present invention is a value from the method described in Examples which will be described later.

The curable composition of the present invention preferably has a surface tension at 23° C. of 27 to 33 mN/m. The lower limit is, for example, preferably 28 mN/m or more, and more preferably 29 mN/m or more. The upper limit is, for example, preferably 32 mN/m or less, and more preferably 31 mN/m or less. By setting the value to fall within such a range, the ink jet jetting accuracy or the mold releasability can be improved. Further, the value of the surface tension in the present invention is a value measured by the method described in Examples which will be described later.

Since the curable composition of the present invention has excellent ink jet jetting accuracy, it is suitable as a photocurable composition for imprints, which is for use in ink jet coating.

<Pattern Forming Method>

Next, a pattern forming method of the present invention will be described. In the pattern forming method of the present invention, a pattern is formed by a photoimprint method, using the curable composition of the present invention.

Hereinafter, a pattern forming method using the curable composition of the present invention will be described in detail. In the pattern forming method of the present invention, the curable composition of the present invention is first applied onto a substrate or a mold having a pattern, and the curable composition of the present invention is sandwiched between the mold and the substrate. Then, the curable composition of the present invention is irradiated with light (exposed) in a state where the curable composition is sandwiched between the mold and the substrate to cure the curable composition of the present invention. Lastly, the mold is released. In this manner, a pattern of the cured product is obtained.

By using coating methods which are generally known, such as a dip coating method, an air knife coating method, a curtain coating method, a wire bar coating method, a gravure coating method, an extrusion coating method, a spin coating method, a slit scan coating method, and an ink jet method as a method for applying the curable composition of the present invention onto a substrate or a mold having a pattern, a coated film or liquid droplets can be disposed on the substrate. In particular, since the curable composition of the present invention has excellent ink jet jetting accuracy and good temporal stability, it is suitable as an ink jet method. It is effective, in particular, for an ink jet method using an ink jet device in which a curable composition is stored in a container open to the atmosphere (for example, an ink cartridge).

When the curable composition of the present invention is sandwiched between the mold and the substrate, helium gas may be introduced between the mold and the substrate. By using such a method to promote the transmission of a gas through a quartz mold, the loss of residual bubbles can be promoted. Further, by reducing the dissolved oxygen in the curable composition, it is possible to suppress the inhibition of radical polymerization in the exposure. In addition, a condensable gas instead of helium may be introduced between the mold and the substrate. By using such a method, the introduced condensable gas is condensed and its volume is reduced, through which the disappearance of the remaining bubbles can further be promoted. The condensable gas refers to a gas that is condensed depending on a temperature and a pressure, and trichlorofluoromethane and 1,1,1,3,3-pentafluoropropane, for example, can be used. For the condensable gas, reference can be made, for example, to the descriptions in paragraph 0023 of JP2004-103817A and paragraph 0003 of JP2013-254783A, the contents of which are incorporated herein.

During the exposure, the illuminance of the exposure is preferably set to a range of 1 to 200 mW/cm$^2$. By setting the illuminance to 1 mW/cm$^2$ or more, the exposure time can be shortened, and thus, the productivity can be improved, and by setting the illuminance to 200 mW/cm$^2$ or less, there is a tendency that deterioration of the characteristics of the cured film due to the occurrence of side reactions can be suppressed, which is thus preferable. The exposure dose is preferably set to a range of 5 to 1,000 mJ/cm$^2$.

During the exposure, in order to suppress the inhibition of radical polymerization due to oxygen, it is preferable to introduce an inert gas such as oxygen, nitrogen, helium, argon, and carbon dioxide so as to control the oxygen concentration in the atmosphere to 10 kPa or less. More preferably, the oxygen concentration in the atmosphere is 3 kPa or less, and more preferably 1 kPa or less.

The pattern forming method of the present invention may also include a step of curing the curable composition of the present invention by irradiation with light, followed by applying heat to the cured pattern to further perform curing, if desired. In a case of heating and curing the curable composition of the present invention after irradiation with light, the heating temperature is preferably 150° C. to 280° C., and more preferably 200° C. to 250° C. In addition, the heating time is preferably 5 to 60 minutes, and more preferably 15 to 45 minutes.

Specific examples of the pattern forming method include those described in paragraph Nos. 0125 to 0136 of JP2012-169462A, the contents of which are incorporated herein.

The pattern forming method of the present invention can be applied to a pattern reversal method. Specifically, the method is as follows. A resist pattern is formed on a substrate to be processed, which includes a carbon film (SOC), by the pattern forming method of the present invention. Next, after coating the resist pattern with an Si-containing film (SOG), an upper portion of the Si-containing film is etched back to expose the resist pattern, and the exposed resist pattern is removed by oxygen plasma or the like to form a reversal pattern of the Si-containing film. Further, with the reversal pattern of the Si-containing film as an etching mask, the carbon film on the underlayer thereof is etched such that the reversal pattern is transferred onto the carbon film. Finally, with the carbon film onto which the reversal pattern has been transferred, the substrate is etching-processed. For examples of such a method, reference can be made to JP1993-267253A (JP-H05-267253A), JP2002-110510A, paragraphs 0016 to 0030 of JP2006-521702A, and JP2010-541193A, the contents of which are incorporated herein.

The pattern forming method of the present invention may include a step of applying an underlayer film composition onto a substrate to form an underlayer film, a step for applying the curable composition of the present invention onto the surface of the underlayer film, a step of irradiating the curable composition of the present invention and the underlayer film with light in a state where the curable composition and the underlayer film are sandwiched between the substrate and the mold having a pattern to cure the curable composition of the present invention, and a step of releasing the mold. In addition, after applying the underlayer film composition onto the substrate, a part of the underlayer film composition may be cured by heat or irradiation with light, and then the curable composition of the present invention may be applied thereon.

The underlayer film composition includes, for example, a curable main agent. The curable main agent may be thermally curable or photocurable, but is preferably thermally curable. The curable main agent preferably has a molecular weight of 400 or more, and it may be a low molecular compound or a polymer, but is preferably a polymer. The molecular weight of the curable main agent is preferably 500 or more, more preferably 1,000 or more, and still more preferably 3,000 or more. The upper limit of the molecular weight is preferably 200,000 or less, more preferably 100,000 or less, and still more preferably 50,000 or less. By setting the molecular weight to 400 or more, volatilization of the components can be more effectively suppressed. As the curable main agent, for example, a polymer having a constructional unit represented by the following general formula as a main component can be used.

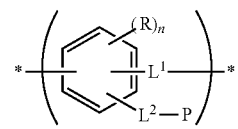

In the general formula, R is an alkyl group, L$^1$ and L$^2$ are each a divalent linking group, P is a polymerizable group, and n is an integer of 0 to 3.

R is preferably an alkyl group having 1 to 5 carbon atoms, and more preferably a methyl group.

L$^1$ is preferably an alkylene group, more preferably an alkylene group having 1 to 3 carbon atoms, and still more preferably —CH$_2$—.

L$^2$ is —CH$_2$—, —O—, —CHR (R is a substituent)-, and a divalent linking group formed by a combination of two or more of these groups. R is preferably an OH group.

P is preferably a (meth)acryloyl group, and more preferably an acryloyl group.

n is preferably an integer of 0 to 2, and more preferably 0 or 1.

Examples of a commercially available product thereof include NK OLIGO EA-7140/PGMAc (manufactured by Shin-Nakamura Chemical Co., Ltd.). Other examples include those described in paragraph Nos. 0040 to 0056 of JP2009-503139A, the contents of which are incorporated therein.

The content of the curable main agent is preferably 30% by mass or more, more preferably 50% by mass or more, and still more preferably 70% by mass or more, of all the components excluding the solvent. Two or more kinds of the curable main agents may be used, and in this case, the total content thereof preferably falls within the range.

The underlayer film composition preferably contains a solvent. A preferable solvent is a solvent having a boiling point of 80° C. to 200° C. at normal pressure. With regard to the kind of solvent, any solvent that can dissolve the underlayer film composition therein can be used, but is preferably a solvent only having one or more of an ester structure, a ketone structure, a hydroxyl group, and an ether structure. Specifically, preferred solvents are a single solvent or a mixed solvent selected from propylene glycol monomethyl ether acetate, cyclohexanone, 2-heptanone, gamma-butyrolactone, propylene glycol monomethyl ether, and ethyl lactate, and a solvent containing propylene glycol monomethyl ether acetate is particularly preferable from the viewpoint of the coating uniformity.

The content of the solvent in the underlayer film composition is optimally adjusted depending on the viscosity of the components excluding the solvent, coatability, and a desired film thickness. From the viewpoint of improving the coatability, the solvent can be added in an amount in a range of 70% by mass or more, preferably 90% by mass or more, more preferably 95% by mass or more, and still more preferably 99% by mass or more, of the entire composition.

The underlayer film composition may contain, as with other components, at least one of a surfactant, a thermal polymerization initiator, a polymerization inhibitor, or a catalyst. The amount of these other components to be blended is preferably 50% by mass or less with respect to all the components excluding the solvent.

For the underlayer film composition, for example, the compositions described in paragraph Nos. 0017 to 0054 of JP2014-192178A or paragraph Nos. 0017 to 0068 of JP2014-024322A, the contents of which are incorporated herein, can be used.

The underlayer film composition can be prepared by mixing the respective components described above. After mixing the respective components described above, the mixture is preferably filtered, for example, through a filter having a pore diameter of 0.003 µm to 5.0 µm. Filtration may be carried out in multiple steps or may be repeated plural times. Further, the filtered liquid can also be refiltered. Examples of the filter include those described in the preparation of the curable composition described above.

Examples of the method for applying the underlayer film composition include a dip coating method, an air knife coating method, a curtain coating method, a wire bar coating method, a gravure coating method, an extrusion coating method, a spin coating method, a slit scan coating method, and an ink jet method. It is preferable that the underlayer film composition is applied onto the substrate and then dried. A preferred drying temperature is 70° C. to 130° C. Preferably, the film is further cured using active energy (preferably heat and/or light). Preferably, curing under heat is carried out at a temperature of 150° C. to 250° C. The step of drying the solvent and the step of curing may be carried out at the same time. As described above, it is preferable that the underlayer film composition is applied, followed by curing of a portion of the underlayer film composition under heat or irradiation with light, and then the curable composition of the present invention is applied. If such a means is adopted and used, there is tendency that during the photo-curing of the curable composition of the present invention, the underlayer film composition becomes completely cured, and the adhesiveness is further improved.

The film thickness of the underlayer film varies depending on the applications in which the underlayer film is used, but is approximately 0.1 nm to 100 nm, preferably 1 to 20 nm, and more preferably 2 to 10 nm. Further, the underlayer film composition may be applied by multiple coating. The obtained underlayer film is preferably as flat as possible.

The substrate (a substrate or a support) can be selected depending on various applications, and examples thereof include, but not particularly limited to, quartz, glass, an optical film, a ceramic material, a deposited film, a magnetic film, a reflective film, a metal substrate with Ni, Cu, Cr, Fe, or the like, paper, polymer substrates such as a polyester film, a polycarbonate film, and a polyimide film, a thin-film transistor (TFT) array substrate, an electrode panel of plasma display (PDP), an electrically conductive substrate with indium tin oxide (ITO), a metal, or the like, electrically insulting substrates such as glass and plastics, and semiconductor-manufacturing substrates with silicon, silicon nitride, polysilicon, silicon oxide, amorphous silicon, Spin On Glass (SOG), and Spin On Carbon (SOC).

<Pattern>

A pattern formed by the pattern forming method of the present invention as described above can be used as a permanent film for use in a liquid crystal display device (LCD) or the like, or as an etching resist for processing a semiconductor. Further, it is possible to produce a polarizing plate having a low reflection or absorption and a large size (for example, more than 55 inches or 60 inches) of an image surface at low cost by forming a grid pattern on a glass substrate of LCD, using the pattern of the present invention. For example, the polarizing plate described in JP2015-132825A or WO2011/132649A can be produced. Incidentally, 1 inch is 25.4 mm.

The pattern can be preferably used for, for example, the manufacture of a semiconductor integrated circuit, a microelectromechanical system (MEMS), recording media such as an optical disc and a magnetic disc, light-receiving elements such as a solid-state imaging device, light-emitting elements such as an LED and an organic EL, optical devices such as a liquid crystal display device (LCD), optical components such as a diffraction grating, a relief hologram, an optical waveguide, an optical filter, and a microlens array, a thin-film transistor, an organic transistor, a color filter, an antireflection film, a polarizing element, an optical film, members for flat panel display, such as a main material, a nanobio device, an immunoassay chip, a deoxyribonucleic acid (DNA) separation chip, a microreactor, a photonic liquid crystal, a guide pattern for forming a micropattern (directed self-assembly, DSA) using self-assembly of a block copolymer, or the like.

In addition, the pattern obtained using the curable composition of the present invention also has a good solvent resistance. It is preferable that the pattern has a high solvent resistance, and it is particularly preferable that in a case of being immersed in a solvent used for producing a general substrate, for example, a solvent of N-methylpyrrolidone at 25° C. for 10 minutes, no variation in the film thickness is caused.

The pattern formed by the patterning method of the present invention is particularly useful as an etching resist. In a case where the curable composition for imprints of the present invention is used as an etching resist, a nano-order micropattern is formed on the substrate by the pattern forming method of the present invention. Subsequently, in a case of wet etching, the etching is performed with hydrogen fluoride or the like, and in a case of dry etching, the etching is performed with an etching gas such as $CF_4$, whereby a desired pattern can be formed on the substrate. The curable composition for imprints of the present invention has good etching resistance with respect to dry etching using carbon fluoride or the like.

<Method for Manufacturing Device>

The method for manufacturing a device of the present invention includes the pattern forming method described above.

That is, a device can be manufactured by forming a pattern by the method described above, and then applying a method for use in the manufacture of various devices thereto.

The pattern may also be included as a permanent film in the device. Further, using the pattern as an etching mask, a substrate can also be subjected to an etching treatment. For example, dry etching is carried out with the pattern as the etching mask, and the upper layer portion of the substrate is selectively removed. By repeatedly subjecting the substrate to carrying out such a treatment, a device can also be manufactured. Examples of the device include semiconductor devices such as a large-scale integrated circuit (LSI) and liquid crystal display devices.

EXAMPLES

Hereinafter, the present invention will be described in more detail with reference to Examples. The materials, the amounts to be used, the ratios, the details of treatments, the procedures of treatments, and the like shown in Examples below may be appropriately modified while not departing from the gist of the present invention. Therefore, the scope of the present invention is not limited to the specific examples shown below.

(Synthesis Example 1) Synthesis of
Fluorine-Containing Acrylate (B-1)

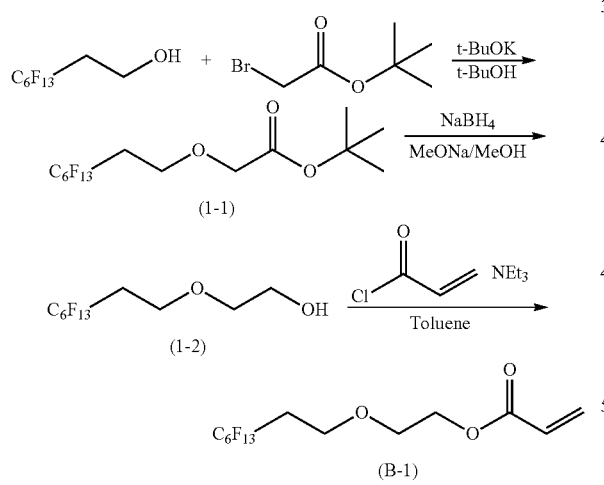

316.9 g (0.87 moles) of 3,3,4,4,5,5,6,6,7,7,8,8,8-tridecafluoro-1-octanol was added dropwise to a solution obtained by dissolving 100 g (0.89 moles) of t-butoxypotassium in 700 mL of t-butanol while the internal temperature was kept at 30° C. or lower in a water bath, thereby preparing an alkoxide solution.

The alkoxide solution prepared above was added dropwise to a mixed liquid of 171.7 g (0.88 moles) of t-butyl bromoacetate and 300 mL of t-butanol while the internal temperature was kept at 30° C. or lower in a water bath. After the completion of the dropwise addition, the mixture was stirred at 25° C. for 1 hour, and then 500 mL of n-hexane and 500 mL of 0.1 mol/L aqueous hydrochloric acid were added thereto to perform a liquid-separation extraction. The organic layer was washed twice with 500 mL of water and then concentrated under a reduced pressure to obtain an intermediate (1-1) (harvested quantity of 406.1 g, yield of 97.6%).

154.3 g of a 28% by mass sodium methoxide solution was added to a solution obtained by mixing 382.6 g (0.80 moles) of the intermediate (1-1) and 800 mL of methanol, then 23.9 g (0.63 moles) of sodium tetrahydroborate was added thereto, and the mixture was reacted at 40° C. for 4 hours. After completion of the reaction, the reaction liquid was slowly added to 1 L of a 2 mol/L aqueous hydrochloric acid to decompose the excess sodium tetrahydroborate, and then 300 mL of ethyl acetate and 800 mL of n-hexane were added thereto to perform a liquid-separation extraction. The organic layer was washed with 1,000 mL of water, and then concentrated under reduced pressure. The obtained concentrated product was distilled under reduced pressure to obtain 326.2 g (boiling point: 80° C. to 84° C./0.40 kPa, yield of 99.9%) of an intermediate (1-2).

100.3 g (0.96 moles) of triethylamine was added to a solution obtained by mixing 326.2 g (0.799 moles) of the intermediate (1-2) and 800 mL of toluene, and then 83.2 g (0.92 moles) of acryloyl chloride was added dropwise thereto while the internal temperature was kept at 15° C. or lower in an ice bath. After the completion of the dropwise addition, the mixture was stirred for 2 hours, 800 mL of 2% by mass aqueous sodium bicarbonate was added thereto to perform a liquid-separation extraction. The organic layer was washed twice with 800 mL of 1 mol/L aqueous hydrochloric acid, and then with 800 mL of water. Then, 38 mg of 4-hydroxy-2,2,6,6-tetramethylpiperidin-1-oxyl-free radicals (4-HO-TEMPO) was added thereto and the mixture was concentrated under reduced pressure. 380 mg of benzoic acid 4-hydroxy-2,2,6,6-tetramethylpiperidin-1-oxyl-free radicals (4-BzO-TEMPO) were added to the obtained concentrated product and the mixture was distilled under reduced pressure to obtain 230.0 g of a desired fluorine-containing acrylate (B-1) (boiling point at 0.67 kPa: 107° C., yield of 62.3%).

(Synthesis Example 2) Synthesis of
Fluorine-Containing Acrylate (B-2)

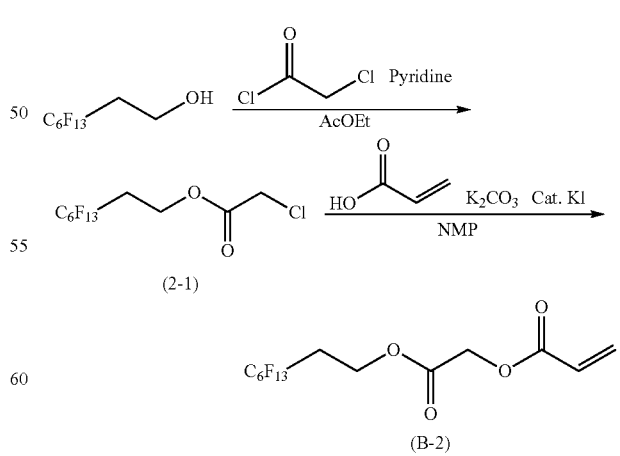

87.0 g (1.1 moles) of pyridine was added dropwise to a mixed liquid of 364.2 g (1.0 moles) of 3,3,4,4,5,5,6,6,7,7,8,8,8-tridecafluoro-1-octanol, 124.2 g (1.1 moles) of chloroacetic acid chloride and 1,000 mL of ethyl acetate while the internal temperature was kept at 15° C. or lower in an ice bath. After the completion of the dropwise addition, the mixture was reacted at 15° C. for 2 hours, and then 500 mL of water was added thereto to perform a liquid-separation extraction. The organic layer was washed with 500 mL of 2% by mass aqueous sodium bicarbonate, and then with 500 mL of 0.1 mol/L aqueous hydrochloric acid and then concentrated under reduced pressure to obtain 432.8 g (yield of 98.1%) of an intermediate (2-1).

43.3 g (0.6 moles) of acrylic acid and 8.3 g (0.05 moles) of potassium iodide were added to a mixed liquid of 220.3 g (0.5 moles) of the intermediate (2-1), 82.9 g (0.6 moles) of potassium carbonate, and 500 mL of N-methylpyrrolidone, and the mixture was reacted at 25° C. for 3 hours. After the completion of the reaction, 500 mL of n-heptane, 500 mL of n-hexane, and 500 mL of water were added thereto to perform a liquid-separation extraction. The organic layer was washed twice with 500 mL of 0.1 mol/L aqueous hydrochloric acid, and then 22 mg of 4-HO-TEMPO was added thereto and the mixture was concentrated under reduced pressure. 220 mg of 4-BzO-TEMPO was added to the obtained concentrated product and the mixture was distilled under reduced pressure to obtain 219.0 g of a desired fluorine-containing acrylate (B-2) (boiling point at 0.67 kPa: 124° C., yield of 92.0%).

(Synthesis Example 3) Synthesis of Fluorine-Containing Acrylate (B-3)

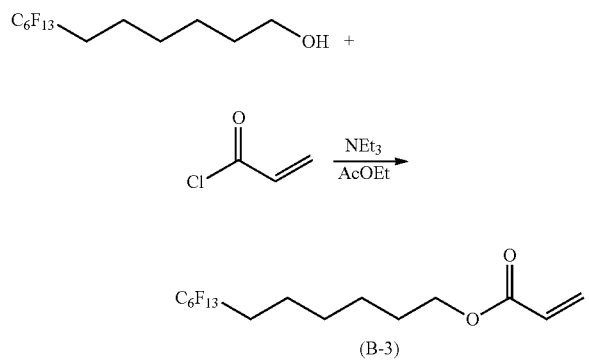

21.7 g (0.24 moles) of acryloyl chloride was added dropwise to a mixed liquid of 84.0 g (0.20 moles) of 7,7,8,8,9,9,10,10,11,11,12,12,12-tridecafluoro-1-dodecanol, 24.3 g (0.24 moles) of triethylamine and 500 mL of ethyl acetate while the internal temperature was kept at 10° C. or lower in an ice bath. After the completion of the dropwise addition, the mixture was reacted at room temperature for 2 hours, and then 500 mL of water was added thereto to perform a liquid-separation extraction. The organic layer was washed with 500 mL of 2% by mass aqueous sodium bicarbonate and then with 500 mL of 1 mol/L aqueous hydrochloric acid, and lastly with 500 mL of pure water. Then, 8 mg of 4-HO-TEMPO was added thereto and the mixture was concentrated under reduced pressure. 80 mg of 4-BzO-TEMPO was added to the obtained concentrated product, and the mixture was distilled under reduced pressure to obtain 69.8 g of a desired fluorine-containing acrylate (B-3) (boiling point at 0.67 kPa: 111° C., yield of 73.6%).

(Synthesis Example 4) Synthesis of Monofunctional Chained Aliphatic Acrylate (A1-4)

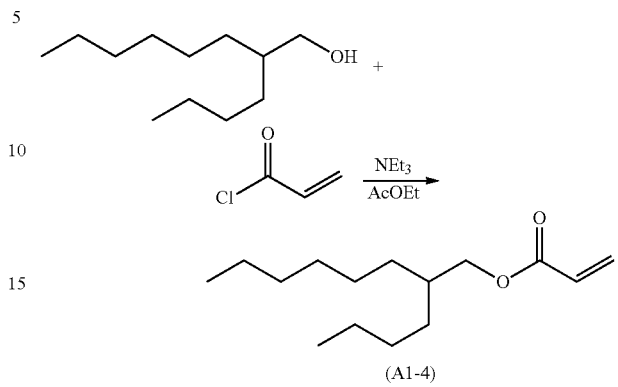

21.7 g (0.24 moles) of acryloyl chloride was added dropwise to a mixed liquid of 37.2 g (0.20 moles) of 2-butyl-1-octanol, 24.3 g (0.24 moles) of triethylamine and 500 mL of ethyl acetate while the internal temperature was kept at 10° C. or lower in an ice bath. After the completion of the dropwise addition, the mixture was reacted at room temperature for 2 hours, and then 500 mL of water was added thereto to perform a liquid-separation extraction. The organic layer was washed with 500 mL of 2% by mass aqueous sodium bicarbonate and then with 500 mL of 1 mol/L aqueous hydrochloric acid, and lastly with 500 mL of pure water. Then, 8 mg of 4-HO-TEMPO was added thereto and the mixture was concentrated under reduced pressure. 80 mg of 4-BzO-TEMPO was added to the obtained concentrated product, and the mixture was distilled under reduced pressure to obtain 37.2 g of a desired monofunctional chained aliphatic acrylate (A1-4) (boiling point at 0.67 kPa: 128° C., yield of 77.3%).

<Preparation of Photocurable Composition for Imprints>

The monofunctional chained aliphatic (meth)acrylate (A1) not containing a fluorine atom, the bifunctional or higher polyfunctional (meth)acrylate (A2) not containing a fluorine atom, the monofunctional (meth)acrylate (B) containing a fluorine atom, the photopolymerization initiator (C), and the non-polymerizable compound (D) having a polyoxyalkylene structure were mixed at the mass ratios shown in Table 1 below, and further, 4-hydroxy-2,2,6,6-tetramethylpiperidin-1-oxyl-free radicals (manufactured by Tokyo Kasei Kogyo Co., Ltd.) as a polymerization inhibitor was added thereto in a proportion of 200 ppm (0.02% by mass) with respect to the curable composition, and then the mixture was filtered through a 0.1 μm PTFE filter to prepare the photocurable compositions X-1 to X-10 for imprints of the present invention.

With regard to the comparative curable compositions R-1 to R-4, in the same manner as with the curable composition of the present invention except for using the comparative compound (S), comparative curable compositions R-1 to R-4 were prepared.

The surface tension and the viscosity at 23° C. of the curable compositions for imprints of the present invention and the comparative curable composition were measured and are all described in Table 1.

The surface tension was measured by a technique of immersing a lower end of a platinum plate into a measurement sample at 23±0.2° C., using a surface tension meter CBVP-A3 manufactured by Kyowa Interface Science Co., Ltd. Incidentally, as the platinum plate, a platinum plate which has been subject to glowing with an alcohol lamp before measurement and has the surface washed was used.

The viscosity was measured by setting the rotation speed to 50 rpm using an E-type rotational viscometer RE85L, manufactured by Toki Sangyo Co., Ltd. and a standard cone/rotor (1° 34'×R24), and adjusting the sample cup to a temperature of 23±0.1° C.

TABLE 1

| | Boiling point (° C.)/0.67 kPa | X-1 | X-2 | X-3 | X-4 | X-5 | X-6 | X-7 | X-8 | X-9 | X-10 | R-1 | R-2 | R-3 | R-4 |
|---|---|---|---|---|---|---|---|---|---|---|---|---|---|---|---|
| A1-1 | 105 | 19 | | | | | | 19 | | | | | | 19 | 19 |
| A1-2 | 111 | | 19 | | | | | | | | | | | | |
| A1-3 | 130 | | | 19 | | | | | | | | | | | |
| A1-4 | 128 | | | | 19 | | | | | | | | | | |
| A1-5 | 137 | | | | | 19 | | | 19 | 19 | 18 | | | | |
| A1-6 | 160 | | | | | | 19 | | | | | | | | |
| A2-1 | 108 | 19 | 19 | 19 | 19 | 19 | 19 | 19 | 19 | 19 | 18 | 19 | 19 | 19 | 19 |
| A2-2 | — | 57 | 57 | 57 | 57 | 57 | 57 | 57 | 57 | 57 | 56 | 57 | 57 | 57 | 57 |
| B-1 | 107 | 3 | 3 | 3 | 3 | 3 | 3 | | | | 3 | | | | |
| B-2 | 124 | | | | | | | 3 | 3 | | | | | | |
| B-3 | 111 | | | | | | | | | 3 | | | | | |
| C-1 | — | 2 | 2 | 2 | 2 | 2 | 2 | 2 | 2 | 2 | 2 | 2 | 2 | 2 | 2 |
| D-1 | — | | | | | | | | | | 3 | | | | |
| S-1 | 132 | | | | | | | | | | | 19 | | | |
| S-2 | 80 | | | | | | | | | | | | 19 | | |
| S-3 | 93 | | | | | | | | | | | | 3 | 3 | |
| S-4 | <40 | | | | | | | | | | | | | | 3 |
| Viscosity (mPa · s) | | 6.7 | 6.8 | 6.9 | 6.9 | 7.0 | 7.2 | 6.8 | 7.0 | 7.0 | 7.5 | 7.9 | 6.6 | 6.8 | 6.8 |
| Surface tension (mN/m) | | 30 | 30 | 30 | 30 | 30 | 30 | 32 | 32 | 29 | 30 | 22 | 22 | 22 | 32 |

The details of the monofunctional chained aliphatic (meth)acrylate (A1) not containing a fluorine atom, the bifunctional or higher polyfunctional (meth)acrylate (A2) not containing a fluorine atom, photopolymerization initiator (C), non-polymerizable compound (D) having a polyoxyalkylene structure, and comparative compound (S), which were used in Examples and Comparative Examples, are as follows.

<Monofunctional Chained Aliphatic (Meth)Acrylate (A1) Not Containing Fluorine Atom>

A1-1: 3-Propylheptyl acrylate (manufactured by BASF)

A1-2: Decyl acrylate (Synthesized in the same manner as in Synthesis Example 4)

A1-3: Undecyl acrylate (Synthesized in the same manner as in Synthesis Example 4)

A1-4: 2-Butyloctyl acrylate (Synthesized in the same manner as in Synthesis Example 4)

A1-5: Dodecyl acrylate (LIGHT ACRYLATE L-A manufactured by Kyoeisha Chemical Co., Ltd.)

A1-6: Tetradecyl acrylate (manufactured by Tokyo Kasei Kogyo Co., Ltd.)

<Bifunctional or Higher Polyfunctional (Meth)Acrylate (A2) Not Containing Fluorine Atom>

A2-1: Neopentyl glycol diacrylate (LIGHT ACRYLATE NP-A manufactured by Kyoeisha Chemical Co., Ltd.)

A2-2: m-Xylylene bisacrylate (Synthesized from α,α'-dichloro-m-xylene and acrylic acid)

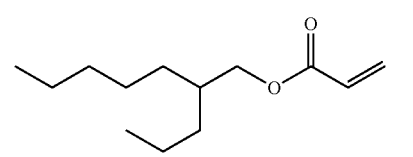

A1-1

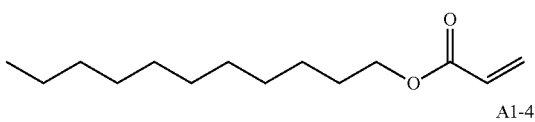

A1-2

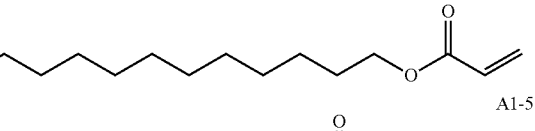

A1-3

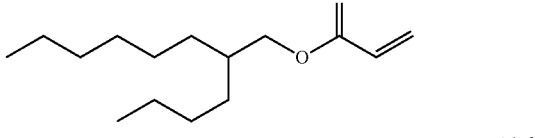

A1-4

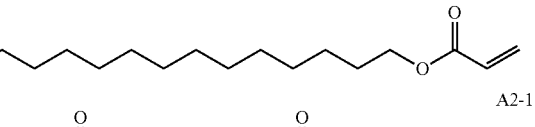

A1-5

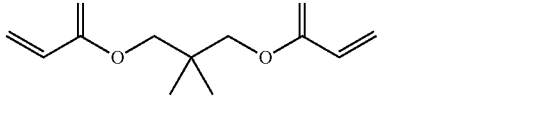

A1-6

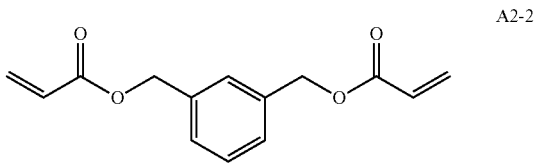

A2-1

A2-2

<Photopolymerization Initiator (C)>
C-1: IRGACURE 819 (manufactured by BASF)
<Non-Polymerizable Compound (D) having Polyoxyalkylene Structure>
D-1: Polypropylene glycol (number-average molecular weight of 700, manufactured by Wako Pure Chemical Industries, Ltd.)
<Comparative Compound (S)>
S-1: 2-Phenoxyethyl acrylate (LIGHT ACRYLATE PO-A manufactured by Kyoeisha Chemical Co., Ltd.)
S-2: 2-Ethylhexyl acrylate (manufactured by Toagosei Co., Ltd.)
S-3: 1H,1H,2H,2H-Heptadecafluorodecyl acrylate (manufactured by Tokyo Kasei Kogyo Co., Ltd.)
S-4: 1H,1H-Undecafluorohexyl acrylate (manufactured by SynQuest Laboratories, Inc.)

S-1
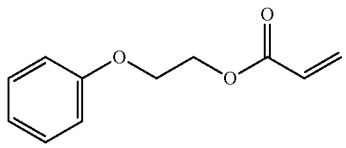

S-2
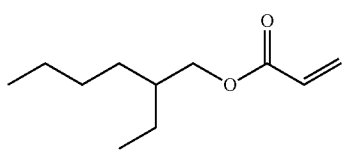

S-3
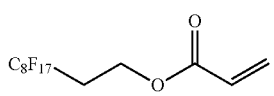

S-4
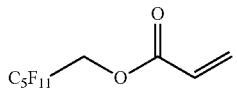

<Preparation of Underlayer Film Composition>
3 g of NK OLIGO EA-7140/PGMAc (manufactured by Shin-Nakamura Chemical Co., Ltd.) was dissolved into 997 g of propylene glycol monomethyl ether acetate, and the mixture was filtered through a 0.1 μm-PTFE filter to obtain an underlayer film composition.

NK OLIGO EA-7140/PGMAc (solid content of 70%)
Average m+n=4, Average n/(m+n)=0.5
(Evaluation)
The obtained composition was evaluated as follows. The results are shown in Table 2 below.
<Ink Jet Jetting Accuracy>
The photocurable composition for imprints having a temperature adjusted to 23° C. was jetted onto a silicon wafer using an ink jet printer DMP-2831 (manufactured by FUJIFILM Dimatix, Inc.) at an amount of liquid droplets of 1 pl per nozzle, thereby forming a square matrix of liquid droplets applied onto the silicon wafer with a 100 μM pitch.
2,500 dots in a 5 mm square area on the coated substrate were observed, and the shifts from the square matrix were measured to calculate a standard deviation σ. The ink jet jetting accuracy was evaluated by ranking A to D as described below.
A: σ<3 μm
B: 3 μm≤σ<5 μm
C: 5 μm≤σ<10 μm
D: 10 μm≤σ
<Evaluation of Releasability>
The underlayer film composition was spin-applied onto a silicon wafer, and heated on a hot plate at 100° C. for 1 minute to dry out the solvent. By further heating on a hot plate at 220° C. for 5 minutes to cure the underlayer film composition, an underlayer film was formed. The film thickness of the cured underlayer film was 3 nm.
The curable composition having a temperature adjusted to 23° C. was jetted onto the surface of the underlayer film on the silicon wafer, using an ink jet printer DMP-2831 (manufactured by FUJIFILM Dimatix, Inc.) at an amount of liquid droplet of 1 pl per nozzle, so as to coat a square matrix of liquid droplets applied onto the underlayer film with about a 100 μm pitch.
The curable composition applied onto the underlayer film was brought into contact with a quartz mold (line/space=1/1, line width=30 nm, groove depth=60 nm, line edge roughness=3.0 nm) under a reduced pressure of 0.1 atm, and then exposed from the side of the quartz mold using a high-pressure mercury lamp under a condition of 100 mJ/cm². After the exposure, the quartz mold was released and the mold releasing force (F) at that moment was measured. The releasing force (F) was measured in accordance with the method described in [0102] to [0107] of JP2011-206977A, and evaluated by ranking S to D as described below.
S: F<12 N
A: 12 N≤F<15 N
B: 13 N≤F<15 N
C: 15 N≤F<20 N
D: 20 N≤F

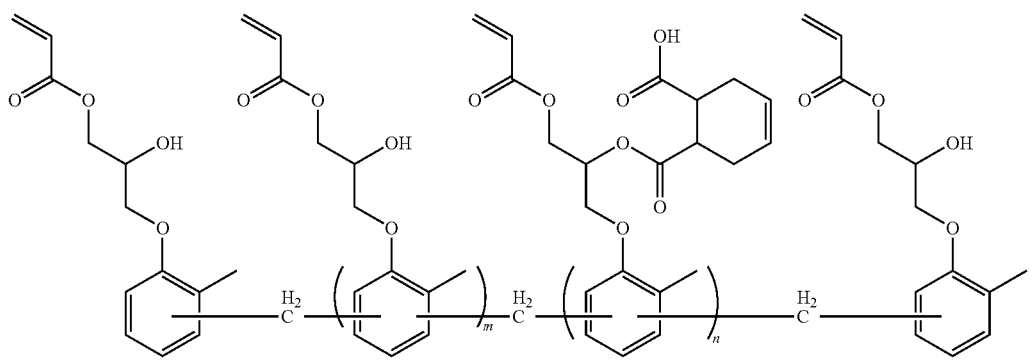

<Evaluation of Stability after Storage over Time for 3 Months>

The respective photocurable compositions for imprints in a state of being charged in a Material Cartridge for an ink jet printer DMP-2831 were stored for 3 months in an environment of a temperature of 23° C. and a humidity of 50%, and the ink jet jetting accuracy and the releasability were evaluated.

TABLE 2

| | Curable composition | Before storage over time | | After storage over time for 3 months | |
|---|---|---|---|---|---|
| | | Releas-ability | IJ jetting accuracy | Releas-ability | IJ jetting accuracy |
| Example 1 | X-1 | B | A | B | A |
| Example 2 | X-2 | B | A | B | A |
| Example 3 | X-3 | A | A | A | A |
| Example 4 | X-4 | A | A | A | A |
| Example 5 | X-5 | A | A | A | A |
| Example 6 | X-6 | A | A | A | A |
| Example 7 | X-7 | B | B | B | B |
| Example 8 | X-8 | A | B | A | B |
| Example 9 | X-9 | B | A | B | A |
| Example 10 | X-10 | S | A | S | A |
| Comparative Example 1 | R-1 | D | D | D | D |
| Comparative Example 2 | R-2 | B | D | D | D |
| Comparative Example 3 | R-3 | B | D | C | D |
| Comparative Example 4 | R-4 | B | B | C | D |

As apparent from the results in the table, the curable compositions of the Examples had excellent releasability before the temporal test as well as after the storage of 3 months. In addition, in comparison between before the temporal test and after the storage of 3 months, deterioration in the ink jet jetting accuracy could not be seen, both cases showing good performance, and in addition, the releasability was also excellent.

On the other hand, the curable compositions of Comparative Examples had distinctive deterioration in the releasability and the ink jet jetting accuracy after 3 months.

What is claimed is:

1. A photocurable composition for imprints, comprising:
    a monofunctional chained aliphatic (meth)acrylate (A1) not containing a fluorine atom;
    a bifunctional or higher polyfunctional (meth)acrylate (A2) not containing a fluorine atom;
    a monofunctional (meth)acrylate (B) containing a fluorine atom;
    a photopolymerization initiator (C), and
    a non-polymerizable compound (D) having a polyoxyalkylene structure in a proportion of 1% to 5% by mass,
    wherein the monofunctional chained aliphatic (meth) acrylate (A1) not containing a fluorine atom has a boiling point of 100° C. to 200° C. at a pressure of 0.67 kPa, and
    the monofunctional (meth)acrylate (B) containing a fluorine atom has a boiling point of 100° C. to 200° C. at a pressure of 0.67 kPa.

2. The photocurable composition for imprints according to claim 1, wherein the monofunctional chained aliphatic (meth)acrylate (A1) not containing a fluorine atom is an ester of a linear or branched aliphatic alcohol having 9 to 16 carbon atoms and a (meth)acrylic acid.

3. The photocurable composition for imprints according to claim 1, wherein the monofunctional (meth)acrylate (B) containing a fluorine atom is represented by the following General Formula (I),

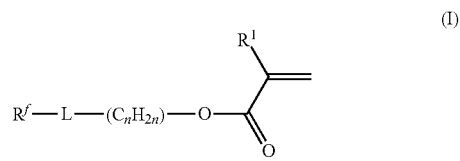

in the formula, $R^f$ represents a fluorine-containing alkyl group having 1 to 9 carbon atoms, in which at least one of the hydrogen atoms of the alkyl group is substituted with a fluorine atom, L represents a single bond, —O—, —OC(=O)—, or —C(=O)O—, $R^1$ represents a hydrogen atom or a methyl group, and n is an integer of 1 to 8, and in a case where L is a single bond, n represents an integer of 3 to 8.

4. The photocurable composition for imprints according to claim 3, wherein in General Formula (I), $R^f$ represents a fluorine-containing alkyl group having 1 to 9 carbon atoms, with 40% to 100% of hydrogen atoms in the alkyl group being substituted with fluorine atoms.

5. The photocurable composition for imprints according to claim 3, wherein in General Formula (I), $R^f$ represents a group formed of a perfluoroalkyl group having 4 to 6 carbon atoms and an alkylene group having 1 to 3 carbon atoms.

6. The photocurable composition for imprints according to claim 1, wherein the monofunctional chained aliphatic (meth)acrylate (A1) not containing a fluorine atom is included in the proportion of 10% to 40% by mass.

7. The photocurable composition for imprints according to claim 1, wherein the monofunctional (meth)acrylate (B) containing a fluorine atom is included in the proportion of 1% to 5% by mass.

8. The photocurable composition for imprints according to claim 1, having a viscosity of 5 to 12 mPa·s and a surface tension of 27 to 33 mN/m at 23° C.

9. The photocurable composition for imprints according to claim 1, which is for use in ink jet.

10. A pattern forming method comprising:
    applying the photocurable composition for imprints according to claim 1 onto a substrate or a mold having a pattern;
    sandwiching the photocurable composition for imprints between the mold and the substrate;
    irradiating the photocurable composition for imprints with light in a state where the photocurable composition for imprints is sandwiched between the mold and the substrate to cure the photocurable composition for imprints; and
    releasing the mold.

11. The pattern forming method according to claim 10, wherein the photocurable composition for imprints is applied onto the substrate or the mold having a pattern by an ink jet method.

12. A method for manufacturing a device, comprising: etching the substrate, using a pattern prepared by the pattern forming method according to claim 10 as a mask.

13. The photocurable composition for imprints according to claim 1, wherein the mass ratio of the monofunctional (meth)acrylate (A1) to the polyfunctional (meth)acrylate (A2) is 10:90 to 40:60.

14. The photocurable composition for imprints according to claim 1,
wherein the polyfunctional (meth)acrylate (A2) comprises a (meth)acrylate (A2-1) having an aromatic structure.

* * * * *